US011867538B2

(12) United States Patent
Min (10) Patent No.: US 11,867,538 B2
(45) Date of Patent: Jan. 9, 2024

(54) LOWER DISPLAY SENSOR (71) Applicant: HANGZHOU SINGLE MICRO ELECTRONIC CO., LTD., Zhejiang (CN)

(72) Inventor: Byung Il Min, Suwon-si (KR)

(73) Assignee: HANGZHOU SINGLE MICRO ELECTRONIC CO., LTD., Zhejiang (CN)

( * ) Notice: Subject to any disclaimer, the term of this patent is extended or adjusted under 35 U.S.C. 154(b) by 0 days.

(21) Appl. No.: 17/056,770

(22) PCT Filed: Jan. 15, 2020

(86) PCT No.: PCT/CN2020/072107
§ 371 (c)(1),
(2) Date: Nov. 19, 2020

(87) PCT Pub. No.: WO2021/142638
PCT Pub. Date: Jul. 22, 2021

(65) Prior Publication Data
US 2022/0341761 A1 Oct. 27, 2022

(51) Int. Cl.
G01D 5/34 (2006.01)
(52) U.S. Cl.
CPC .................... *G01D 5/344* (2013.01)
(58) Field of Classification Search
CPC ...... G01D 5/344; G06F 3/011; H03K 17/968; G01S 17/02; G09G 5/10; G09G 2360/142; G09G 2360/144; G09G 2370/04; G02B 5/3025; G02B 27/283; H04N 25/134; H04N 25/133; G01J 1/0429; G01J 1/0492;
(Continued)

(56) References Cited

U.S. PATENT DOCUMENTS 8,558,970 B2 * 10/2013 Obata ................. G02F 1/13363
359/489.02
11,163,159 B1 * 11/2021 Rong ......................... G06T 7/50
(Continued)

FOREIGN PATENT DOCUMENTS

CN 102160023 A 8/2011
CN 103390633 A * 11/2013 ........... H01L 27/323
(Continued)

OTHER PUBLICATIONS

"Transflective Liquid Crystal Displays", Zhu et al., IEEE/OSA Journal of Display Tech. vol. 1 (2005) pp. 15-29 (Year: 2005).*
Search report of corresponding CN application No. 2020800018742.

*Primary Examiner* — Mohamed K Amara
(74) *Attorney, Agent, or Firm* — Gang Yu (57) ABSTRACT

The disclosure relates to a lower display sensor. The lower display sensor includes: a light sensor, including a light irradiation portion that irradiates an induction light used for sensing an object located outside a display, and a light receiving portion that detects a reflected light reflected by the induction light from the object; a first sensor polarizing layer, disposed on an upper portion of the light sensor and having a polarizing axis inclined at a first angle; and a first sensor delay layer, disposed on an upper portion of the sensor polarizing layer and having a slow axis inclined at a first angle with respect to the polarizing axis.

9 Claims, 6 Drawing Sheets (58) Field of Classification Search
CPC ...... G01J 1/4204; G01J 1/4228; G01J 5/0802; G01J 5/60
See application file for complete search history.

(56) References Cited

U.S. PATENT DOCUMENTS

| | | | | |
|---|---|---|---|---|
| 2010/0019666 A1* | 1/2010 | Park | G02B 5/3025 | 313/504 |
| 2015/0036215 A1* | 2/2015 | Uchida | G02B 5/0278 | 359/489.09 |
| 2016/0103015 A1* | 4/2016 | Ichihashi | G01J 1/08 | 250/225 |
| 2016/0154156 A1* | 6/2016 | Ichihashi | G01J 1/0214 | 349/194 |
| 2018/0357462 A1* | 12/2018 | Mackey | G02F 1/13338 | |
| 2019/0392752 A1* | 12/2019 | Chen | G02B 27/283 | |
| 2020/0191648 A1* | 6/2020 | Wang | G09G 3/3208 | |

FOREIGN PATENT DOCUMENTS

| | | | | |
|---|---|---|---|---|
| CN | 204155595 U | | 2/2015 | |
| CN | 105676555 A | * | 6/2016 | ........... G02F 1/1326 |
| CN | 105974697 A | | 9/2016 | |
| CN | 106200094 A | | 12/2016 | |
| CN | 108881538 A | | 11/2018 | |
| CN | 109036163 A | | 12/2018 | |
| CN | 109425427 A | | 3/2019 | |
| CN | 111968602 A | * | 11/2020 | ............ G01J 1/0429 |
| CN | 111968603 A | * | 11/2020 | ............ G01J 1/0429 |
| CN | 114373384 A | * | 4/2022 | ........... G01J 1/0418 |
| DE | 102015109782 A1 | * | 6/2016 | ........... G02B 27/281 |
| JP | 2008046329 A | * | 2/2008 | ....... G02F 1/133528 |
| JP | 4559162 B2 | | 10/2010 | |
| KR | 20160003499 A | | 1/2016 | |
| TW | 200928489 A | | 7/2009 | |
| WO | WO-2021249823 A1 | * | 12/2021 | ................ G01J 1/04 |

* cited by examiner

LOWER DISPLAY SENSOR

CROSS-REFERENCE TO RELATED INVENTIONS

The disclosure is a national stage application of International Patent Application No. PCT/CN2020/072107, which is filed on Jan. 15, 2020, entitled "Lower Display Sensor", the disclosure of which is hereby incorporated by reference in its entirety.

TECHNICAL FIELD

The disclosure relates to a light sensor disposed on a lower portion of a display.

BACKGROUND

A light sensor is not only used for mobile electronic devices such as mobile phones or tablet computers, but also used for image electronic devices such as televisions and monitors. The light sensor includes, for example, an illumination sensor, a proximity sensor, a proximity illumination sensor, and the like. The proximity sensor is a light sensor that measures a distance between a user and an electronic device, and the illumination sensor is a light sensor that senses a peripheral brightness of the electronic device. The proximity illumination sensor incorporating the optical proximity sensor and the illumination sensor implements two sensors within a single package.

Recently, there has been an increase in designs where the display occupies almost an entire front surface of the electronic device. Although the size of the display becomes larger as required to require a large picture, there is still a need to ensure at least a portion of the region of the front surface to configure a camera, particularly the proximity illumination sensor. The proximity sensor using ultrasonic waves or the like may be applied to a structure in which the front surface is covered by the display, but it is difficult to integrate a function of sensing illumination. On the other hand, the illumination sensor may not be able to sense ambient light due to a housing used to protect the electronic device, although it may also be located in a region other than the front surface. Therefore, although the most desirable position to be able to set the proximity illumination sensor is the front surface of the electronic device, in the design where the display occupies the entire front surface, it is difficult to secure the position where the usual proximity illumination sensor is configured.

SUMMARY

Some embodiments of the disclosure provide a light sensor which is applied to an electronic device of such a design that an entire front surface is occupied by a display.

In an embodiment, a lower display sensor, disposed on a lower portion of a display including a pixel generating light, a display delay layer disposed on an upper portion of the pixel, and a display polarizing layer is provided. The lower display sensor includes: a light sensor, including a light irradiation portion that irradiates an induction light used for sensing an object located outside the display, and a light receiving portion that detects a reflected light reflected by the induction light from the object; a first sensor polarizing layer, disposed on an upper portion of the light sensor and having a polarizing axis inclined at a first angle; and a first sensor delay layer, disposed on an upper portion of the sensor polarizing layer and having a slow axis inclined at a first angle with respect to the polarizing axis. Here, the first sensor polarizing layer and the first sensor delay layer convert the induction light into an inductive sensor circularly polarized light so as to pass through the display polarizing layer, and the inductive sensor circularly polarized light is converted into an inductive sensor linearly polarized light with a same polarizing axis as the polarizing axis of the display polarizing layer through the display delay layer.

In an embodiment, the slow axis of the first sensor delay layer is parallel to a slow axis of the display delay layer, and a polarizing axis of the display polarizing layer is inclined at a second angle with respect to the slow axis of the display delay layer.

In an embodiment, a difference between the second angle and the first angle is 90 degrees.

In an embodiment, the lower display sensor further includes a second sensor polarizing layer, the second sensor polarizing layer and the first sensor polarizing layer are disposed on a same plane and the second sensor polarizing layer has a polarizing axis inclined at a second angle.

In an embodiment, the light receiving portion includes: a first light receiving portion, disposed on a lower portion of the first sensor polarizing layer to detect a first sensor linearly polarized light generated from external light and a second sensor linearly polarized light generated from light generated inside the display; and a second light receiving portion, disposed on a lower portion of the second sensor polarizing layer to detect a third sensor linearly polarized light generated from light generated inside the display.

In an embodiment, the lower display sensor further includes a second sensor delay layer, the second sensor delay layer and the first sensor delay layer are disposed on a same plane, and the second sensor delay layer has a slow axis orthogonal to the slow axis of the first sensor delay layer.

In an embodiment, the light receiving portion includes: a first light receiving portion, disposed on a lower portion of the first sensor polarizing layer corresponding to the first sensor delay layer to detect a first sensor linearly polarized light generated from an external light and a second sensor linearly polarized light generated from light generated inside the display; and a second light receiving portion, disposed on the lower portion of the first sensor polarizing layer corresponding to the second sensor delay layer to detect a third sensor linearly polarized light generated from light generated inside the display.

In an embodiment, a brightness of the external light is corrected by applying a proper proportional relationship between a brightness of the second sensor linearly polarized light and a brightness of the third sensor linearly polarized light in an environment not affected by the external light.

According to an embodiment of the disclosure, the illumination sensor is applied to an electronic device of such a design that an entire front surface is occupied by a display.

BRIEF DESCRIPTION OF THE DRAWINGS

Hereinafter, the disclosure will be described with reference to the embodiments shown in the drawings. For ease of understanding, in all the drawings, the same components are denoted with the same reference numerals. The structures shown in the drawings are merely illustrative of embodiments of the disclosure and are not intended to limit the scope of the disclosure. In particular, some components are somewhat exaggerated in order to facilitate an understanding of the disclosure. Since the drawings are for the purpose of understanding the means of the disclosure, it is to be understood that the widths, thicknesses, etc. of the components illustrated in the drawings may vary in actual implementation.

DETAILED DESCRIPTION OF THE EMBODIMENTS

While the disclosure is amenable to various modifications and alternative embodiments, specifics thereof have been shown by way of example in the drawings and will be described in detail. It should be understood that this is not intended to limit the disclosure to the particular implementation manner, but on the contrary, the present intention is to cover all modifications, equivalents, and alternatives falling within the spirit and technical scope of the disclosure. In particular, the functions, features, embodiments described below with reference to the figures can be implemented separately or in combination with another embodiment. Therefore, it is to be noted that the scope of the disclosure is not limited to the manner shown in the drawings.

On the other hand, with respect to the terms used in the present specification, the expressions "substantially", "almost", "about" and the like are expressions which take into account the margins allowed or possible errors in actual implementation. For example, in the case of "substantially 90 degrees", it should be interpreted that an angle at which the same effect as the effect at 90 degrees can be obtained is also included. For another example, "hardly any" should be interpreted as being included to the extent that it can be ignored, if at all.

On the other hand, "side" or "horizontal" is used to indicate left and right directions in the drawings, and "vertical" is used to indicate up and down directions in the drawings, without particular mention. In addition, without being specifically defined, angles, angles of incidence, and the like are referenced to a virtual straight line perpendicular to a horizontal plane represented in the drawings.

The same reference numbers will be used throughout the drawings to refer to the same or like parts. In addition, the hatching shown in a delay layer indicates the direction of a slow axis, and the hatching shown in a polarizing layer schematically indicates the direction of a polarizing axis with respect to the slow axis extending in a horizontal direction.

Figure 1:
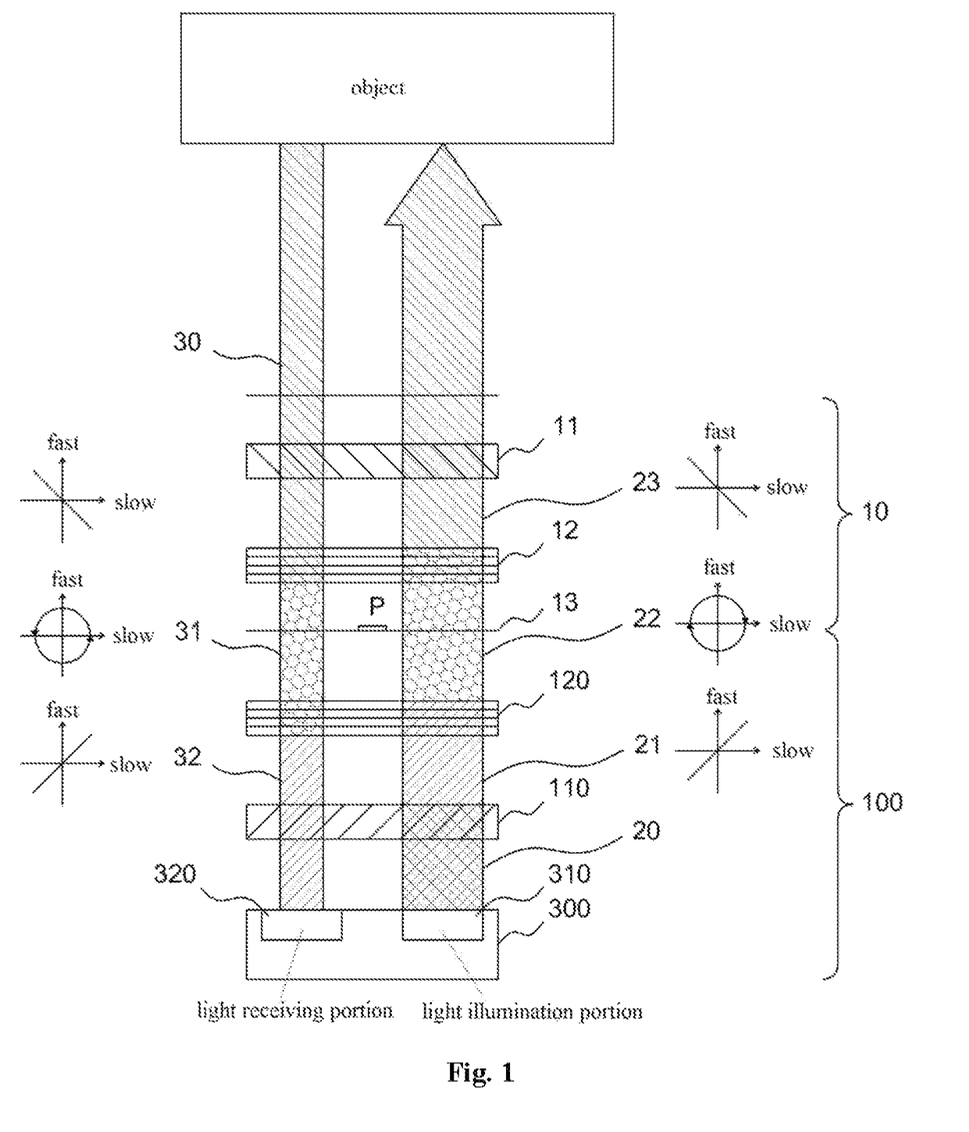
FIG. 1 is a diagram for schematically illustrating an embodiment of a lower display sensor.

FIG. 1 is a diagram for schematically illustrating an embodiment of a lower display sensor.

A lower display sensor 100 includes a sensor polarizing layer 110, a sensor delay layer 120, and a light sensor 300. The light sensor 300 operates as a proximity sensor, and for this purpose includes a light irradiation portion 310 and a light receiving portion 320. In an embodiment, the light irradiation portion 310 is a light emitting diode that generates induction light belonging to visible light, near infrared, and infrared bands. The light receiving portion 320 is capable of detecting reflected light belonging to visible light, near infrared, and infrared bands. For example, the light receiving portion 320 may be formed of a single photodiode or may be formed of multiple photodiodes. In the case of being formed of multiple photodiodes, it is possible to divide into more than two regions, and the band of detected light of each region is different. To avoid interference, the light irradiation portion 310 and the light receiving portion 320 are optically separated. Although not shown, a collimating lens for improving the straightness of the induction light is disposed on an upper portion of the light irradiation portion 310, and a condensing lens for condensing the reflected light is disposed on an upper portion of the light receiving portion 320.

The sensor polarizing layer 110 is disposed on an upper portion of the light sensor 300 and has a polarizing axis inclined at a first angle, for example +45 degrees, with respect to a slow axis of the sensor delay layer 120. The sensor delay layer 120 is disposed on an upper portion of the sensor polarizing layer 110, and for example, has a slow axis extending in a horizontal direction and a fast axis extending in a vertical direction. The slow axis of the sensor delay layer 120 is substantially parallel to the slow axis of a display delay layer 12.

The sensor polarizing layer 110 and the sensor delay layer 120 enable the induction light generated by the light irradiation portion 310 to be emitted to an outside through a display 10. In addition, the sensor polarizing layer 110 and the sensor delay layer 120 enable reflected light reflected by an external object to pass through the display 10 to the light receiving portion 320.

The light irradiation portion 310 generates induction light 20 as unpolarized light. The generated induction light 20 becomes an inductive sensor linearly polarized light 21 having a polarizing axis inclined at a first angle as it passes through the sensor polarizing layer 110. Since the polarizing axis of the inductive sensor linearly polarized light 21 is inclined, for example, at +45 degrees with respect to the slow axis of the sensor delay layer 120, the inductive sensor linearly polarized light 21 becomes an inductive sensor circularly polarized light 22 rotated in a clockwise direction as it passes through the sensor delay layer 120. If a first polarizing portion of the inductive sensor linearly polarized light 21 transmitted along a fast axis and a second polarizing portion of the inductive sensor linearly polarized light 21 transmitted along the slow axis have passed through the sensor delay layer 120, a phase difference of $\lambda/4$ is generated between each other. The inductive sensor circularly polarized light 22 is incident inside the display through a bottom surface of the display 10.

The inductive sensor circularly polarized light 22 becomes an inductive display linearly polarized light 23 as it passes through the display delay layer 12. Since the slow axis of the display delay layer 12 is substantially parallel to the slow axis of the sensor delay layer 120, the first polarizing portion and the second polarizing portion of the inductive sensor circularly polarized light 22 are increased by a phase difference of $\lambda/4$ so that the phase difference between each other becomes $\lambda/2$. Therefore, the polarizing axis of the inductive display linearly polarized light 23 is rotated for about 90 degrees from a first angle and inclined at a second angle, for example, −45 degrees with respect to the slow axis of the display delay layer 12.

The inductive display linearly polarized light 23 advances externally substantially losslessly through the display polarizing layer 11. The display polarizing layer 11 has a polarizing axis inclined at a second angle, for example, −45 degrees, with respect to the slow axis of the display delay layer 12. Therefore, the inductive display linearly polarized light 23 having a polarizing axis inclined at the same angle as the polarizing axis of the display polarizing layer 11 can pass through the display polarizing layer 11.

The inductive display linearly polarized light 23 emitted to the outside of the display 10 is reflected by an object and re-incident on the display 10. For differentiation, the reflected light incident on the display 10 is referred to as reflected display linearly polarized light 30. In an embodiment, the reflected display linearly polarized light 30 has a polarizing axis inclined at a second angle, for example, −45 degrees. Therefore, the reflected display linearly polarized light 30 having a polarizing axis inclined at the same angle as the polarizing axis of the display polarizing layer 11 can pass through the display polarizing layer 11.

The reflected display linearly polarized light 30 passes through the display delay layer 12 to become a reflected display circularly polarized light 31 that is rotated in a counterclockwise direction. As described above, since the polarizing axis of the display polarizing layer 11 is inclined at −45 degrees with respect to the slow axis of the display delay layer 12, a phase difference of $\lambda/4$ is generated between the first polarizing portion and the second polarizing portion of the reflected display linearly polarized light 30. The reflected display circularly polarized light 31 is incident on the lower display sensor 100 through the bottom surface of the display 10.

The reflected display circularly polarized light 31 passes through the sensor delay layer 120 to become a reflected sensor linearly polarized light 32. As described above, since the slow axis of the display delay layer 12 is substantially parallel to the slow axis of the sensor delay layer 120, the first polarizing portion and the second polarizing portion of the reflected display circularly polarized light 31 are increased by a phase difference of $\lambda/4$ so that the phase difference between the first polarizing portion and the second polarizing portion of the reflected display circularly polarized light 31 becomes $\lambda/2$. Therefore, the polarizing axis of the reflected sensor linearly polarized light 32 is rotated for about 90 degrees from a second angle and inclined at a first angle, for example, +45 degrees with respect to the slow axis of the sensor delay layer 120.

The reflected sensor linearly polarized light 32 advances to the light receiving portion 320 through the sensor polarizing layer 110 substantially without loss. The sensor polarizing layer 110 has a polarizing axis inclined at a first angle, for example, +45 degrees, with respect to the slow axis of the sensor delay layer 120. Therefore, the reflected sensor linearly polarized light 32 having a polarizing axis inclined at the same angle as the polarizing axis of the sensor polarizing layer 110 can pass through the sensor polarizing layer 110.

Figure 2:
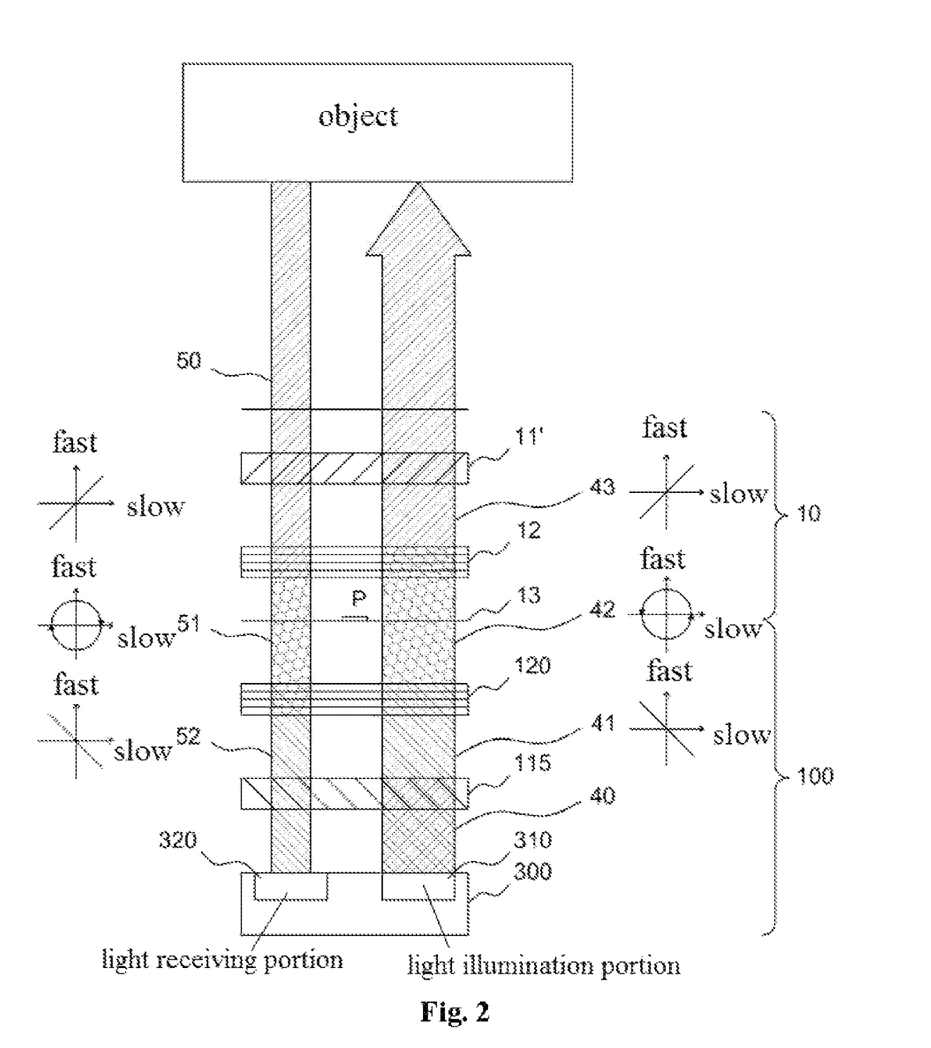
FIG. 2 is a diagram for schematically illustrating another embodiment of a lower display sensor.

FIG. 2 is a diagram for schematically illustrating another embodiment of a lower display sensor.

A lower display sensor 100 includes a sensor polarizing layer 115, a sensor delay layer 120, and a light sensor 300. The light sensor 300 operates as a proximity sensor, and for this purpose includes a light irradiation portion 310 and a light receiving portion 320. In an embodiment, the light irradiation portion 310 is a light emitting diode that generates induction light belonging to visible light, near infrared, and infrared bands. The light receiving portion 320 is capable of detecting reflected light belonging to visible light, near infrared, and infrared bands.

The sensor polarizing layer 115 is disposed on an upper portion of the light sensor 300 and has a polarizing axis inclined at a second angle, for example −45 degrees, with respect to a slow axis of the sensor delay layer 120. The sensor delay layer 120 is disposed on an upper portion of the sensor polarizing layer 115, and has, for example, a slow axis extending in a horizontal direction and a fast axis extending in a vertical direction. The slow axis of the sensor delay layer 120 is substantially parallel to the slow axis of a display delay layer 12.

The sensor polarizing layer 115 and the sensor delay layer 120 enable the induction light generated by the light irradiation portion 310 to be emitted to the outside through a display 10. In addition, the sensor polarizing layer 115 and the sensor delay layer 120 enable light reflected by an external object to pass through the display 10 to the light receiving portion 320.

The light irradiation portion 310 generates unpolarized induction light 40. The generated induction light 40 becomes an inductive sensor linearly polarized light 41 having a polarizing axis inclined at a second angle as it passes through the sensor polarizing layer 115. Since the polarizing axis of the inductive sensor linearly polarized light 41 is inclined, for example, at −45 degrees with respect to the slow axis of the sensor delay layer 120, the inductive sensor linearly polarized light 41 becomes an inductive sensor circularly polarized light 42 rotated in a counterclockwise direction as it passes through the sensor delay layer 120. If a first polarizing portion of the inductive sensor linearly polarized light 41 transmitted along a fast axis and a second polarizing portion of the inductive sensor linearly polarized light 41 transmitted along the slow axis have passed through the sensor delay layer 120, a phase difference of $\lambda/4$ is generated between each other. The inductive sensor circularly polarized light 42 is incident inside the display through a bottom surface of the display 10.

The inductive sensor circularly polarized light 42 becomes an inductive display linearly polarized light 43 as it passes through the display delay layer 12. Since the slow axis of the display delay layer 12 is substantially parallel to the slow axis of the sensor delay layer 120, a first polarizing portion and a second polarizing portion of the inductive sensor circularly polarized light 42 are increased by a phase difference of $\lambda/4$ so that the phase difference between each other becomes $\lambda/2$. Therefore, the polarizing axis of the inductive display linearly polarized light 43 is rotated for about 90 degrees from a second angle and inclined at a first angle, for example, inclined at +45 degrees with respect to the slow axis of the display delay layer 12.

The inductive display linearly polarized light 43 proceeds externally through the display polarizing layer 11 substantially without loss. The display polarizing layer 11 has a polarizing axis inclined at a first angle, for example, +45 degrees, with respect to the slow axis of the display delay layer 12. Therefore, the inductive display linearly polarized light 43 having a polarizing axis inclined at the same angle as the polarizing axis of the display polarizing layer 11 can pass through the display polarizing layer 11.

The inductive display linearly polarized light 43 emitted to the outside of the display 10 is reflected by an object and re-incident on the display 10. The reflected display linearly polarized light 50 has a polarizing axis inclined at a first angle, for example, +45 degrees. Therefore, the reflected display linearly polarized light 50 having a polarizing axis inclined at the same angle as the polarizing axis of the display polarizing layer 11 can pass through the display polarizing layer 11.

The reflected display linearly polarized light 50 passes through the display delay layer 12 to become a reflected display circularly polarized light 51 that is rotated in a clockwise direction. As described above, since the polarizing axis of the display polarizing layer 11 is inclined at −45 degrees with respect to the slow axis of the display delay layer 12, a phase difference of λ/4 is generated between the first polarizing portion and the second polarizing portion of the reflected display linearly polarized light 50. The reflected display circularly polarized light 51 passes through the bottom surface of the display 10 and is incident on the lower display sensor 100.

The reflected display circularly polarized light 51 passes through the sensor delay layer 120 to become reflected sensor linearly polarized light 52. As described above, since the slow axis of the display delay layer 12 is substantially parallel to the slow axis of the sensor delay layer 120, the first polarizing portion and the second polarizing portion of the reflected display circularly polarized light 51 are increased by a phase difference of λ/4 so that the phase difference between each other becomes λ/2. Therefore, the polarizing axis of the reflected sensor linearly polarized light 52 is rotated for about 90 degrees from a first angle and inclined at a second angle, for example, inclined at −45 degrees with respect to the slow axis of the sensor delay layer 120.

The reflected sensor linearly polarized light 52 proceeds to the light receiving portion 320 through the sensor polarizing layer 115 substantially without loss. The sensor polarizing layer 115 may have a polarizing axis inclined at a second angle, for example, −45 degrees, with respect to the slow axis of the sensor delay layer 120. Therefore, the reflected sensor linearly polarized light 52 having a polarizing axis inclined at the same angle as the polarizing axis of the sensor polarizing layer 115 can pass through the sensor polarizing layer 115.

Figure 3:
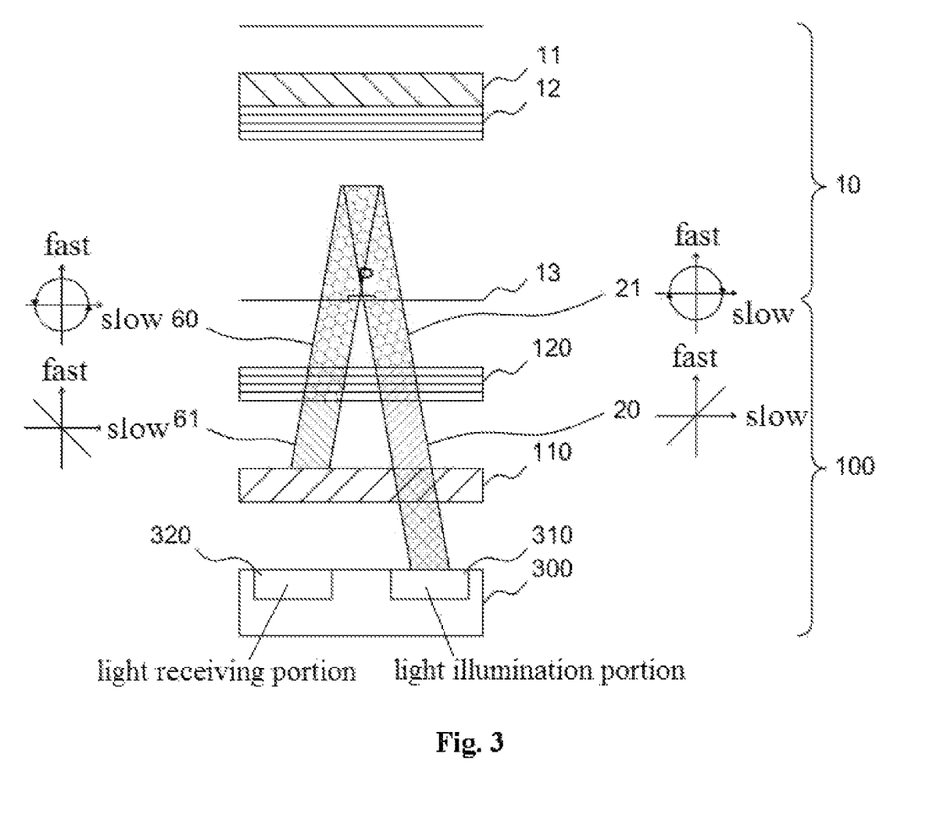
FIG. 3 is a diagram for schematically illustrating a case where light irradiated from a lower display sensor is reflected inside a display.

FIG. 3 is a diagram for schematically illustrating a case where light irradiated from a lower display sensor is reflected inside a display.

The inductive sensor circularly polarized light 21 generated by the lower display sensor 100 can be reflected inside the display 10 and incident again on the lower display sensor 100. Various structures formed by elements that transmit or reflect light are mixed in the display 10. Therefore, a part of the inductive sensor circularly polarized light 21 is internally reflected back to the lower display sensor 100. A part of the internally reflected inductive sensor circularly polarized light 21 should be prevented from advancing toward the light receiving portion 320 because it may cause an error in the presence or absence of an external object or in the determination of the distance to the external object.

The internally reflected sensor circularly polarized light 60 passes through the sensor delay layer 120 to become internally reflected sensor linearly polarized light 61. The polarizing axis of the internally reflected sensor linearly polarized light 61 is rotated for about 90 degrees from the polarizing axis of the inductive sensor linearly polarized light 20. Therefore, the polarizing axis of the internally reflected sensor linearly polarized light 61 is perpendicular to the polarizing axis of the sensor polarizing layer 110, so as to be blocked by the sensor polarizing layer 110.

Figure 4:
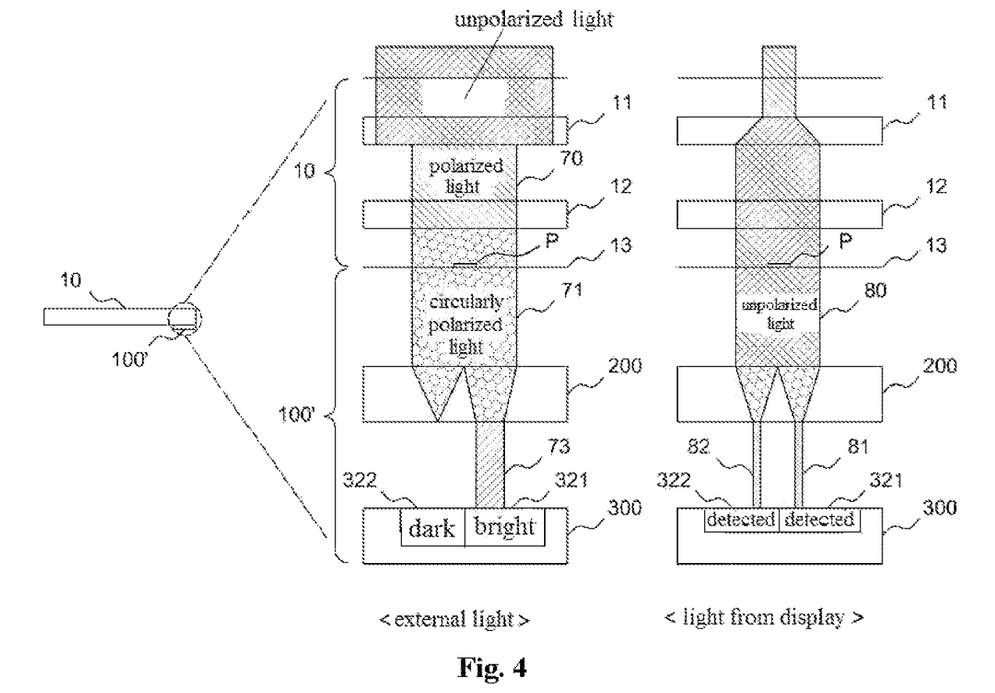
FIG. 4 is a diagram for schematically illustrating a working principle of a lower display sensor.
Figure 5:
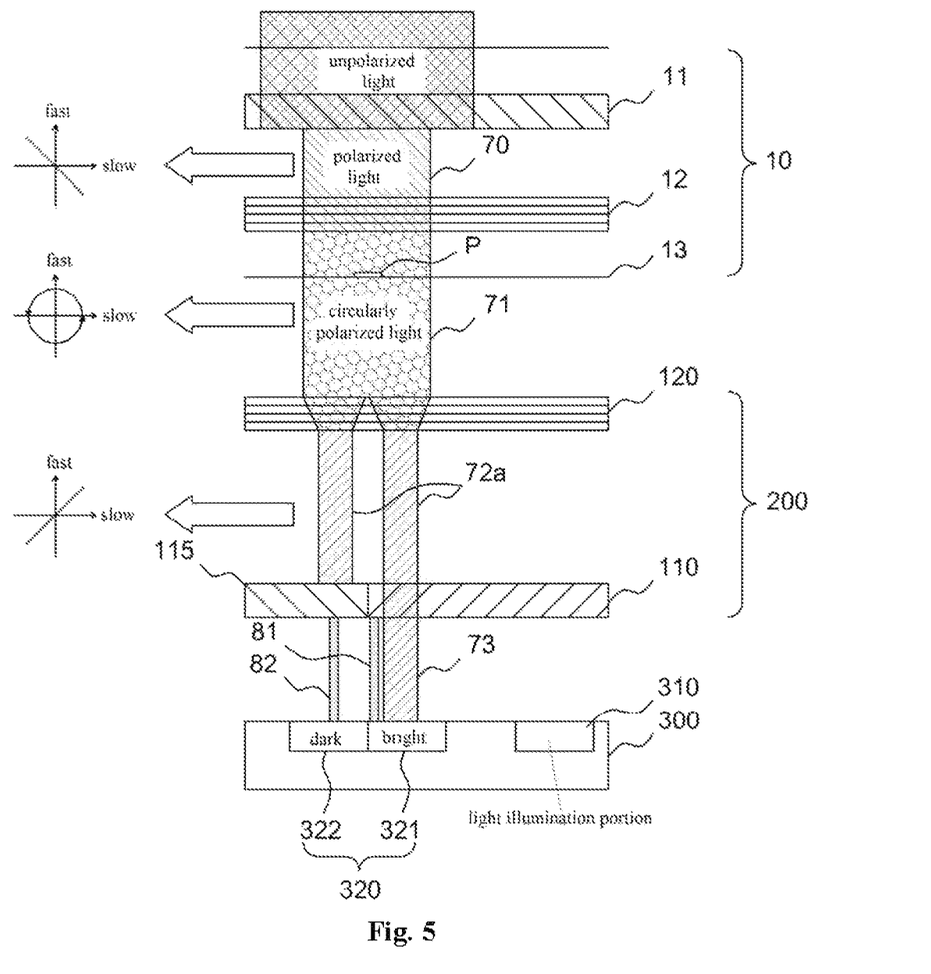
FIG. 5 is a diagram for schematically illustrating an embodiment of a lower display sensor.
Figure 6:
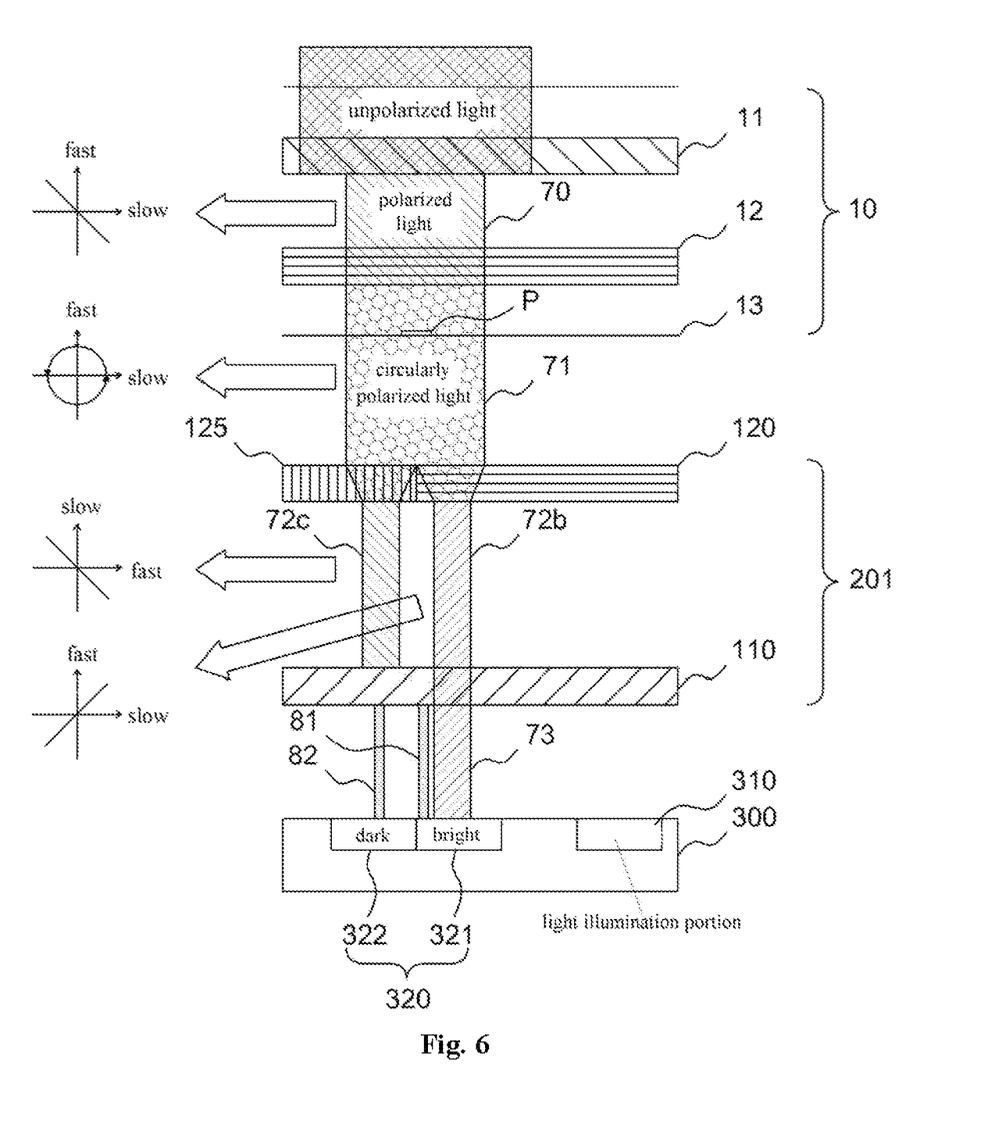
FIG. 6 is a diagram for schematically illustrating another embodiment of a lower display sensor.

FIG. 4 is a diagram for schematically illustrating a working principle of a lower display sensor. Referring to FIG. 4 to FIG. 6, the structure and principle of a lower display sensor 100′ for operating as an illumination sensor will be described.

The lower display sensor 100′ is disposed on a lower portion of a display 10. The display 10 includes: a pixel layer 13 having a plurality of pixels P for generating light, a display polarizing layer 11 and a display delay layer 12 stacked on an upper portion of the pixel layer 13. In order to protect the display polarizing layer 11, the display delay layer 12, and the pixel layer 13, a protective layer formed of an opaque material such as metal or synthetic resin is disposed on a bottom surface of the display 10. As an embodiment, the lower display sensor 100′ composed of a light selection layer 200 and a light sensor 300 may be disposed in a region after removing a portion of the protective layer (hereinafter, referred to as a completed structure). In another embodiment, the light selection layer 200 of the lower display sensor 100′ is manufactured in a film shape and laminated on the bottom surface of the display 10. The illumination sensor (hereinafter, referred to as an assembly type structure) on the lower portion of the display may also be implemented by attaching the light sensor 300 to the bottom surface of the light selection layer 200. Hereinafter, in order to avoid repetition of the description, the description will be made centered on the completed structure.

The display polarizing layer 11 and the display delay layer 12 improve the visibility of the display 10. External light incident through the upper surface of the display 10 is an unpolarized light. If the external light is incident on the upper surface of the display polarizing layer 11, only display linearly polarized light 70 substantially coincident with the polarizing axis of the display polarizing layer 11 passes through the display polarizing layer 11. The display linearly polarized light 70, if has passed through the display delay layer 12, becomes display circularly polarized light (or elliptically polarized light) 71 that is rotated clockwise or counterclockwise. If the display circularly polarized light 71 is reflected by the pixel layer 13 and re-incident on the display delay layer 12, it becomes a second linearly polarized light. Here, if the polarizing axis of the display delay layer 12 is inclined by about 45 degrees with respect to the slow axis, the polarizing axis of the display linearly polarized light 70 and the polarizing axis of the second linearly polarized light are orthogonal to each other. Therefore, the second linearly polarized light, i.e., the external light reflected by the pixel layer 13, is blocked by the display polarizing layer 11 and cannot be emitted to the outside of the display. Therefore, the visibility of the display 10 is improved.

Unpolarized light 80 generated by a pixel P advances not only toward the upper surface of the display 10, but also toward the bottom surface. In addition, a portion of the unpolarized light 80 advancing toward the upper surface is reflected inside the display 10 and advances again toward the bottom surface. Unlike the display circularly polarized light 71, the unpolarized light 80 passes directly through the display delay layer 12 to be linearly polarized by the display polarizing layer 11 and is emitted to the outside.

The lower display sensor 100′ includes a light selection layer 200 having two light paths and a light sensor 300 detecting light passing through each light path. The light incident to the lower display sensor 100′ is the display circularly polarized light 71 generated from the external light and the unpolarized light 80 generated inside the display. The first light path and the second light path within the light selection layer 200 have different effects on the display circularly polarized light 71 and the unpolarized light 80. The first light path enables the passage of both the display circularly polarized light 71 and the unpolarized light 80. In contrast, the second light path enables the passage of the unpolarized light 80 and substantially blocks the display circularly polarized light 71. The display circularly polarized light 71 after passing through the first light path becomes a first sensor linearly polarized light 73, and the unpolarized light 80 after passing through the first light path and the second light path becomes a second sensor linearly polarized light 81 and a third sensor linearly polarized light 82.

In an embodiment, the light sensor 300 includes a first light receiving portion 321 corresponding to the first light path and a second light receiving portion 322 corresponding to the second light path. For example, the first light receiving portion 321 generates a first pixel current substantially proportional to the brightness of the display circularly polarized light 71 and the unpolarized light 80, and the second light receiving portion 322 generates a second pixel current substantially proportional to the brightness of the unpolarized light 80. The first light receiving portion 321 or the second light receiving portion 322 may be composed of, for example, one photodiode or multiple photodiodes (hereinafter, referred to as a PD array). As an embodiment, one or two photodiodes correspond to one pixel P. As another embodiment, the PD array corresponds to one pixel P. As a further embodiment, one or two photodiodes may correspond to multiple pixels P. In another embodiment, the PD array corresponds to multiple pixels P. Here, the first light receiving portion 321 and the second light receiving portion 322 may collectively detect light belonging to a specific wavelength range, or may separately detect light belonging to different wavelength ranges, such as red light, green light, blue light, and near infrared light.

The illumination sensor is a device for measuring the brightness of the external light. In the case where the illumination sensor is disposed on the lower portion of the display, not only the external light passing through the display, but also the light generated inside the display is incident on the illumination sensor. Therefore, in order to accurately measure the brightness of the external light, it is necessary to measure the brightness of the light generated inside the display. If only the brightness of the light generated inside the display can be measured, the measured brightness of the external light can be corrected therethrough.

As described above, the second sensor linearly polarized light 81 and the third sensor linearly polarized light 82 generated from the unpolarized light 80 are detected by the first light receiving portion 321 and the second light receiving portion 322, respectively. In particular, the sensor internal linearly polarized light generated by the light selection layer 200 from the display circularly polarized light 71 is substantially not incident on the second light receiving portion 322, so that the second light receiving portion 322 measures only the brightness of the third sensor linearly polarized light 82 generated from the unpolarized light 80. On the other hand, although described in detail below, the brightness of the second sensor linearly polarized light 81 and the third sensor linearly polarized light 82 may be substantially the same, but may be different on the contrary. However, since the second sensor linearly polarized light 81 and the third sensor linearly polarized light 82 are generated from the unpolarized light 80 generated from one or more pixels, a linear proportional relationship or a non-linear proportional relationship holds in brightness therebetween. The non-linear proportional relationship may be due to a variety of reasons including structural characteristics of the display 10, differences in pixel regions corresponding to the respective light receiving portions, wavelength ranges of the unpolarized light 80, and the like. The proportional relationship between the second sensor linearly polarized light 81 and the third sensor linearly polarized light 82 may be measured in an environment not affected by the external light. According to the proportional relationship, the degree to which the second sensor linearly polarized light 81 contributes to the brightness measured by the first light receiving portion 321 is calculated from the brightness of the third sensor linearly polarized light 82 measured by the second light receiving portion 322. Therefore, the brightness of the external light is precisely measured.

FIG. 5 is a diagram for schematically illustrating an embodiment of a lower display sensor. In FIG. 5 and FIG. 6, only the light emitted through the light selection layer is shown for the unpolarized light emitted from a pixel P in order to simplify the drawing.

The light selection layer 200 includes a sensor delay layer 120, a first sensor polarizing layer 110, and a second sensor polarizing layer 115. The sensor delay layer 120 is disposed on the upper portions of the first sensor polarizing layer 110 and the second sensor polarizing layer 115, and the light sensor 300 is disposed on the lower portions of the first sensor polarizing layer 110 and the second sensor polarizing layer 115. The light sensor 300 includes a light irradiation portion 310 and a light receiving portion 320. The light receiving portion 320 of the light sensor 300 includes: a first light receiving portion 321 disposed on the lower portion of the first sensor polarizing layer 110; and a second light receiving portion 322 disposed on the lower portion of the second sensor polarizing layer 115. During operation as an illumination sensor, the light irradiation portion 310 may be turned off. As an embodiment, the light selection layer 200 is manufactured by stacking (laminating) the sensor delay layer 120 on the upper surfaces of the first sensor polarizing layer 110 and the second sensor polarizing layer 115. The light selection layer 200 may be attached to the bottom surface of the display 10. The light sensor 300 may be attached to the bottom surface of the light selection layer 200. As another embodiment, the light sensor 300 is implemented using thin film transistors. Therefore, the lower display sensor 100' is manufactured by stacking the film-like sensor delay layer 120, the first sensor polarizing layers 110, the second sensor polarizing layer 115, and the light sensor 300.

The polarizing axis of the first sensor polarizing layer 110 and the polarizing axis of the second sensor polarizing layer 115 are inclined at different angles with respect to the slow axis of the sensor delay layer 120. In an embodiment, the polarizing axis of the first sensor polarizing layer 110 is inclined at a first angle, e.g., +45 degrees, with respect to the slow axis of the sensor delay layer 120, and the polarizing axis of the second sensor polarizing layer 115 is inclined at a second angle, e.g., −45 degrees, with respect to the slow axis of the sensor delay layer 120.

The first light receiving portion 321 of the light sensor 300 detects a first sensor linearly polarized light 73 and a second sensor linearly polarized light 81 emitted from the first sensor polarizing layer 110, and the second light receiving portion 322 detects a third sensor linearly polarized light 82 emitted from the second sensor polarizing layer 115. The first light receiving portions 321 and the second light receiving portion 322 generate a pixel current having a magnitude corresponding to the brightness of the detected light. The first light receiving portion 321 and the second light receiving portion 322 are, for example, photodiodes, but are not limited thereto.

Next, the operation of the lower display sensor 100' having the light selection layer 200 constructed as described above will be described.

The display circularly polarized light 71 and the unpolarized light (not shown; 80 in FIG. 4) are incident on the upper surface of the light selection layer 200, i.e. the upper surface of the sensor delay layer 120. The display circularly polarized light 71 is light after the external light passes through the display polarizing layer 11 and the display delay layer 12, and the unpolarized light 80 is light advancing downward from the pixel P toward the light selection layer 200.

In an embodiment, the display polarizing layer 11 has a polarizing axis inclined at a second angle, for example, −45 degrees, with respect to the slow axis of the display delay layer 12. Therefore, the display linearly polarized light 70 after passing through the display polarizing layer 11 can be incident at a second angle with respect to the slow axis of the display delay layer 12. If a first polarizing portion of the display linearly polarized light 70 transmitted along a fast axis and a second polarizing portion of the display linearly polarized light 70 transmitted along the slow axis have passed through the display delay layer 12, a phase difference of $\lambda/4$ is generated between each other. Therefore, the display linearly polarized light 70 after passing through the display delay layer 12 becomes the display circularly polarized light 71 rotated in the counterclockwise direction.

The display circularly polarized light 71 having a phase difference of $\lambda/4$ between the fast axis and the slow axis passes through the sensor delay layer 120 and becomes a sensor internal linearly polarized light 72a. The polarizing axis of the sensor internal linearly polarized light 72a is orthogonal to the polarizing axis of the display linearly polarized light 70. On the other hand, the unpolarized light 80 passes directly through the sensor delay layer 120.

Since the polarizing axis of the first sensor polarizing layer 110 and the polarizing axis of the sensor internal linearly polarized light 72a are substantially parallel, the sensor internal linearly polarized light 72a emitted from the sensor delay layer 120 can pass through the first sensor polarizing layer 110. In contrast, since the polarizing axis of the second sensor polarizing layer 115 is substantially perpendicular to the polarizing axis of the sensor internal linearly polarized light 72a, the sensor internal linearly polarized light 72a is blocked by the second sensor polarizing layer 115. On the other hand, the unpolarized light 80 emitted from the sensor delay layer 120 passes through the first sensor polarizing layer 110 and the second sensor polarizing layer 115 to become a second sensor linearly polarized light 81 and a third sensor linearly polarized light 82, respectively. That is, the first light receiving portion 321 detects the first sensor linearly polarized light 73 and the second sensor linearly polarized light 81 through a first light path constituted by the sensor delay layer 120 and the first sensor polarizing layer 110, and the second light receiving portion 322 detects the third sensor linearly polarized light 82 through a second light path constituted by the sensor delay layer 120 and the second sensor polarizing layer 115.

FIG. 6 is a diagram for schematically illustrating another embodiment of a lower display sensor.

The light selection layer 201 includes a first sensor delay layer 120, a second sensor delay layer 125, and a sensor polarizing layer 110. The first sensor delay layer 120 and the second sensor delay layer 125 are disposed on the upper portion of the sensor polarizing layer 110, and the light sensor 300 is disposed on the lower portion of the sensor polarizing layer 110. The light sensor 300 includes a light irradiation portion 310 and a light receiving portion 320. The light receiving portion 320 includes: a first light receiving portion 321 disposed at a position where light emitted from the first sensor delay layer 120 reaches after passing through the sensor polarizing layer 110; and a second light receiving portion 322 disposed at a position where the light emitted from the second sensor delay layer 125 reaches after passing through the sensor polarizing layer 110. During operation as an illumination sensor, the light irradiation portion 310 is turned off. As an embodiment, the light selection layer 201 is manufactured by laminating the first sensor delay layer 120 and the second sensor delay layer 125 on the upper surface of the sensor polarizing layer 110. The light selection layer 201 is attached to the bottom surface of the display 10. The light sensor 300 is attached to the bottom surface of the light selection layer 201. As another embodiment, the light sensor 300 is implemented using thin film transistors. Therefore, the lower display sensor 100' is manufactured by stacking the film-like first and second sensor delay layers 120, 125, the sensor polarizing layer 110, and the light sensor 300.

The slow axis of the first sensor delay layer 120 is substantially orthogonal to the slow axis of the second sensor delay layer 125. The polarizing axis of the sensor polarizing layer 110 may be inclined at a first angle, e.g., +45 degrees, with respect to the slow axis of the first sensor delay layer 120, or may be inclined at a second angle, e.g., −45 degrees, with respect to the slow axis of the second sensor delay layer 125.

In an embodiment, the first light receiving portion 321 of the light sensor 300 is located at a vertical lower portion of the first sensor delay layer 120, and detects the first sensor linearly polarized light 73 and the second sensor linearly polarized light 81 emitted by the display circularly polarized light 71 through the first sensor delay layer 120 and the sensor polarizing layer 110. The second light receiving portion 322 of the light sensor 300 is located at a vertical lower portion of the second sensor delay layer 125, and detects the third sensor linearly polarized light 82. The first light receiving portion 321 and the second light receiving portion 322 may generate a pixel current having a magnitude corresponding to the brightness of the detected light. The first light receiving portions 321 and the second light receiving portion 322 may be, for example, photodiodes, but are not limited thereto.

Next, the operation of the lower display sensor 100' having the light selection layer 201 constructed as described above will be described. Since the description of the display circularly polarized light 71 and the unpolarized light 80 is the same as in FIG. 5, it is omitted.

The display circularly polarized light 71 and the unpolarized light (not shown; 30 in FIG. 4) are incident on the upper surface of the light selection layer 201, i.e. the upper surfaces of the first sensor delay layer 120 and the second sensor delay layer 125. The display circularly polarized light 71 having a phase difference of $\lambda/4$ between the fast axis and the slow axis passes through the first sensor delay layer 120 to become a first sensor internal linearly polarized light 72b, and passes through the second sensor delay layer 125 to become a second sensor internal linearly polarized light 72c. Since the slow axis of the first sensor delay layer 120 is orthogonal to the slow axis of the second sensor delay layer 125, the polarizing axis of the first sensor internal linearly polarized light 72b and the polarizing axis of the second sensor internal linearly polarized light 72c may also be orthogonal. Specifically, the display circularly polarized light 71 having a phase difference of $\lambda/4$ between the first polarizing portion and the second polarizing portion is added with the phase difference of λ/4 through the first sensor delay layer 120, so that it becomes the first sensor internal linearly polarized light 72b having a polarizing axis substantially perpendicular to the polarizing axis of the display linearly polarized light 70. In contrast, the phase difference of the display circularly polarized light 71 is eliminated by the second sensor delay layer 125, so that it becomes a second sensor internal linearly polarized light 72c having a polarizing axis substantially parallel to the polarizing axis of the display linearly polarized light 70. On the other hand, the unpolarized light 80 passes directly through the first sensor delay layer 120 and the second sensor delay layer 125.

Although the first sensor internal linearly polarized light 72b emitted from the first sensor delay layer 120 passes through the sensor polarizing layer 110, the second sensor internal linearly polarized light 72c emitted from the second sensor delay layer 125 does not pass through the sensor polarizing layer 110. The sensor polarizing layer 110 has a polarizing axis inclined at a first angle, e.g., +45 degrees, with respect to the slow axis of the first sensor delay layer 120, or has a polarizing axis inclined at a second angle, e.g., −45 degrees, with respect to the slow axis of the second sensor delay layer 125. Therefore, since the polarizing axis of the first sensor internal linearly polarized light 72b is substantially parallel to the polarizing axis of the sensor polarizing layer 110, the first sensor internal linearly polarized light 72b can pass through the sensor polarizing layer 110 almost without loss. In contrast, since the polarizing axis of the second sensor internal linearly polarized light 72c is substantially perpendicular to the polarizing axis of the sensor polarizing layer 110, the second sensor internal linearly polarized light 72c can be blocked by the sensor polarizing layer 110. On the other hand, the unpolarized light 80 passing through the first and second sensor delay layers 120,125 passes through the sensor polarizing layer 110 to become the second sensor linearly polarized light 81 and the third sensor linearly polarized light 82. That is, the first light receiving portion 321 can detect the first sensor linearly polarized light 73 and the second sensor linearly polarized light 81 through a first light path constituted by the first sensor delay layer 120 and the sensor polarizing layer 110. On the other hand, the second light receiving portion 322 can detect the third sensor linearly polarized light 82 through a second light path constituted by the second sensor delay layer 125 and the sensor polarizing layer 110.

The above description of the disclosure is exemplary, and it will be understood by those skilled in the art to which the disclosure pertains that other specific forms may be readily changed without changing the technical concept or essential characteristics of the disclosure. Accordingly, it is to be understood that the above-described embodiments are exemplary and not restrictive. Furthermore, the features of the disclosure that are described with reference to the drawings are not limited to the structures shown in the particular drawings, but may be implemented separately or in combination with other features.

The scope of the disclosure is indicated by the appended claims rather than by the foregoing description, and it is to be understood that all changes or modifications that come within the meaning and range of the claims and their equivalents are intended to be embraced therein.

What is claimed is:

1. A lower display sensor, disposed on a lower portion of a display comprising a pixel that generates light, a display delay layer disposed on an upper portion of the pixel, and a display polarizing layer, the lower display sensor comprising:
a light sensor, comprising a light irradiation portion that irradiates an induction light used for sensing an object located outside the display, and a light receiving portion that detects a reflected light reflected by the induction light from the object;
a first sensor polarizing layer, disposed on an upper portion of the light sensor and having a polarizing axis inclined at a first angle; and
a first sensor delay layer, disposed on an upper portion of the first sensor polarizing layer and having a slow axis inclined at a first angle with respect to the polarizing axis, wherein
the first sensor polarizing layer and the first sensor delay layer convert the induction light into an inductive sensor circularly polarized light so as to pass through the display polarizing layer, and
the inductive sensor circularly polarized light is converted into an inductive display linearly polarized light with a same polarizing axis as the polarizing axis of the display polarizing layer through the display delay layer.

2. The lower display sensor according to claim 1, wherein the slow axis of the first sensor delay layer is parallel to a slow axis of the display delay layer; and
a polarizing axis of the display polarizing layer is inclined at a second angle with respect to the slow axis of the display delay layer.

3. The lower display sensor according to claim 2, wherein a difference between the second angle and the first angle is 90 degrees.

4. The lower display sensor according to claim 1, wherein the lower display sensor further comprises a second sensor polarizing layer, the second sensor polarizing layer and the first sensor polarizing layer being disposed on a same plane and the second sensor polarizing layer having a polarizing axis inclined at a second angle.

5. The lower display sensor according to claim 4, wherein the light receiving portion comprises:
a first light receiving portion, disposed on a lower portion of the first sensor polarizing layer to detect a first sensor linearly polarized light generated from an external light and a second sensor linearly polarized light generated from light generated inside the display; and
a second light receiving portion, disposed on a lower portion of the second sensor polarizing layer to detect a third sensor linearly polarized light generated from light generated inside the display.

6. The lower display sensor according to claim 5, wherein a brightness of the external light is corrected by applying a proper proportional relationship between a brightness of the second sensor linearly polarized light and a brightness of the third sensor linearly polarized light in an environment not affected by the external light.

7. The lower display sensor according to claim 1, wherein the lower display sensor further comprises a second sensor delay layer, the second sensor delay layer and the first sensor delay layer being disposed on a same plane and having a slow axis orthogonal to the slow axis of the first sensor delay layer.

8. The lower display sensor according to claim 7, wherein the light receiving portion comprises:
a first light receiving portion, disposed on a lower portion of the first sensor polarizing layer corresponding to the first sensor delay layer to detect a first sensor linearly polarized light generated from an external light and a second sensor linearly polarized light generated from light generated inside the display; and a second light receiving portion, disposed on the lower portion of the first sensor polarizing layer corresponding to the second sensor delay layer to detect a third sensor linearly polarized light generated from light generated inside the display.

9. The lower display sensor according to claim 8, wherein a brightness of the external light is corrected by applying a proper proportional relationship between a brightness of the second sensor linearly polarized light and a brightness of the third sensor linearly polarized light in an environment not affected by the external light.

* * * * *